(12) United States Patent
Yoshikawa et al.

(10) Patent No.: US 11,621,358 B2
(45) Date of Patent: Apr. 4, 2023

(54) SOLAR CELL, SOLAR CELL PRODUCTION METHOD, AND SOLAR CELL MODULE

(71) Applicant: KANEKA CORPORATION, Osaka (JP)

(72) Inventors: Kunta Yoshikawa, Settsu (JP); Hisashi Uzu, Settsu (JP)

(73) Assignee: KANEKA CORPORATION, Osaka (JP)

( * ) Notice: Subject to any disclaimer, the term of this patent is extended or adjusted under 35 U.S.C. 154(b) by 229 days.

(21) Appl. No.: 16/808,150

(22) Filed: Mar. 3, 2020

(65) Prior Publication Data

US 2020/0203539 A1  Jun. 25, 2020

Related U.S. Application Data

(63) Continuation of application No. PCT/JP2018/020586, filed on May 29, 2018.

(30) Foreign Application Priority Data

Sep. 13, 2017 (JP) .............................. JP2017-176193

(51) Int. Cl.
*H01L 31/0224* (2006.01)
*H01L 31/0216* (2014.01)
(Continued)

(52) U.S. Cl.
CPC ............... *H01L 31/022441* (2013.01); *H01L 31/02167* (2013.01); *H01L 31/075* (2013.01); *H01L 31/202* (2013.01)

(58) Field of Classification Search
CPC ....... H01L 31/022441; H01L 31/02245; H01L 31/022458; H01L 31/0516; H01L 31/0682
See application file for complete search history.

(56) References Cited

U.S. PATENT DOCUMENTS

2011/0056545 A1* 3/2011 Ji ..................... H01L 31/022441
136/255
2013/0186456 A1* 7/2013 Ide ...................... H01L 31/1884
136/255
(Continued)

FOREIGN PATENT DOCUMENTS

JP  2009-200267 A  9/2009
JP  2013-131586 A  7/2013
(Continued)

OTHER PUBLICATIONS

English machine translation of Fujiwara (JP-2016164930-A) provided by the EPO website, 2022, All Pages. (Year: 2022).*
(Continued)

*Primary Examiner* — Daniel P Malley, Jr.
(74) *Attorney, Agent, or Firm* — Studebaker & Brackett PC (57) ABSTRACT

A solar cell in which performance degradation caused by an alkali component is suppressed. A solar cell is a back-contact solar cell that comprises a semiconductor substrate; a p-type semiconductor layer, and a first electrode layer corresponding thereto, layered sequentially on one part of the rear side of the semiconductor substrate; an n-type semiconductor layer, and a second electrode layer corresponding thereto, layered sequentially on another part of the rear side of the semiconductor substrate. One part of the n-type semiconductor layer lies directly atop one part of the adjacent p-type semiconductor layer. The first electrode layer is separate from the n-type semiconductor layer and covers the p-type semiconductor layer. The second electrode layer covers the entirety of an overlapping portion where the n-type semiconductor layer lies atop the p-type semiconductor layer.

8 Claims, 9 Drawing Sheets

(51) Int. Cl.
H01L 31/075 (2012.01)
H01L 31/20 (2006.01)

(56) References Cited

U.S. PATENT DOCUMENTS

2016/0197210 A1* 7/2016 Hayashi .............. H01L 31/0747
                                                  136/251
2018/0294366 A1   10/2018 Konishi et al.
2019/0267499 A1*  8/2019 Smith ............... H01L 31/02363

FOREIGN PATENT DOCUMENTS

| JP | 2014-220291 A |   | 11/2014 |
| JP | 2016-164930 A |   | 9/2016  |
| JP | 2016164930 A  | * | 9/2016  |
| WO | 2011/093329 A1 |  | 8/2011  |
| WO | 2017/098790 A1 |  | 6/2017  |

OTHER PUBLICATIONS

PVeducation, "Solar Cells, Modules, and Arrays", (https://pveducation.com/solar-concepts/solar-cells-modules-arrays/), All Pages, 2014. (Year: 2014).*

The extended European search report issued by the European Patent Office dated Aug. 24, 2020, which corresponds to European Patent Application No. 18855885.2-1230 and is related to U.S. Appl. No. 16/808,150.

International Search Report issued in PCT/JP2018/020586; dated Jul. 3, 2018.

* cited by examiner

SOLAR CELL, SOLAR CELL PRODUCTION METHOD, AND SOLAR CELL MODULE

CROSS-REFERENCE TO RELATED APPLICATIONS

This application claims benefit of priority to International Patent Application No. PCT/JP2018/020586, filed May 29, 2018, and to Japanese Patent Application No. 2017-176193, filed Sep. 13, 2017, the entire contents of each are incorporated herein by reference.

BACKGROUND

Technical Field

The present disclosure relates to a back electrode type (back contact type) solar cell, a method of manufacturing the solar cell, and a solar cell module including the solar cell.

Background Art

Examples of a solar cell using a semiconductor substrate include a double-sided electrode type solar cell with electrodes formed on both the light-receptive surface and the back surface, and a back electrode type solar cell with electrodes formed only on the back surface. Since such a double-sided electrode type solar cell has electrodes formed on the light-receptive surface, the electrodes block sunlight. On the other hand, a back electrode type solar cell has no electrodes formed on the light-receptive surface, and thus a back electrode type solar cell is more efficient in receiving sunlight compared with a double-sided electrode type solar cell. Japanese Unexamined Patent Application, Publication No. 2013-131586 discloses a back electrode type solar cell.

The solar cell disclosed in Japanese Unexamined Patent Application, Publication No. 2013-131586 includes a first conductivity type (n-type) semiconductor layer and a first electrode layer sequentially laminated on a part of the back surface of a semiconductor substrate, and a second conductivity type (p-type) semiconductor layer and a second electrode layer sequentially laminated on a different part of the back surface of the semiconductor substrate.

If there is a region on the back surface of the semiconductor substrate where there is no semiconductor layer, the carriers (electrons and electron holes) recombine in this region to cause a reduction in photoelectric conversion efficiency. In regards to this point, in the solar cell disclosed in Japanese Unexamined Patent Application, Publication No. 2013-131586, a part of the second conductivity type (p-type) semiconductor layer lies atop a part of the adjacent first conductivity type (n-type) semiconductor layer. This means that even allowing for manufacturing error, there will be no region in which there is no semiconductor layer, thus suppressing the reduction in photoelectric conversion efficiency.

Furthermore, in some cases, photoelectric conversion efficiency is reduced by a leakage current flowing from the second conductivity type (p-type) semiconductor layer lying atop a part of the first conductivity type (n-type) semiconductor layer through first conductivity type (n-type) semiconductor layer into the first electrode layer formed on the first conductivity type (n-type) semiconductor layer. In regards to this point, in the solar cell disclosed in Japanese Unexamined Patent Application, Publication No. 2013-131586, the first electrode layer is separated from the second conductivity type (p-type) semiconductor layer. This reduces the leakage current from the second conductivity type (p-type) semiconductor layer through the first conductivity type (n-type) semiconductor layer into the first electrode layer, thus suppressing the reduction in photoelectric conversion efficiency.

Furthermore, if the second electrode layer on the second conductivity type (p-type) semiconductor layer is formed in an overlapping region between the first conductivity type (n-type) semiconductor layer and the second conductivity type (p-type) semiconductor layer, photoelectric conversion efficiency is reduced by a leakage current flowing from the first conductivity type (n-type) semiconductor layer through the second conductivity type (p-type) semiconductor layer into the second electrode layer. In regards to this point, in the solar cell disclosed in Japanese Unexamined Patent Application, Publication No. 2013-131586, the second electrode layer formed on the second conductivity type (p-type) semiconductor layer is shorter than the second conductivity type (p-type) semiconductor layer. This reduces the leakage current from the first conductivity type (n-type) semiconductor layer through the second conductivity type (p-type) semiconductor layer into the second electrode layer, thus suppressing the reduction in photoelectric conversion efficiency.

SUMMARY

In the solar cell disclosed in Japanese Unexamined Patent Application, Publication No. 2013-131586, the p-type semiconductor layer and the n-type semiconductor layer may be laminated in the reverse order. That is to say, a part of the second conductivity type (n-type) semiconductor layer may lie atop a part of the adjacent first conductivity type (p-type) semiconductor layer. In this case, as described above, in order to reduce a leakage current, the second electrode layer formed on the second conductivity type (n-type) semiconductor layer is shorter than the second conductivity type (n-type) semiconductor layer in the overlapping region between the first conductivity type (p-type) semiconductor layer and the second conductivity type (n-type) semiconductor layer. That is to say, there is an exposed portion in the overlapping region between the first conductivity type (p-type) semiconductor layer and the second conductivity type (n-type) semiconductor layer where the second conductivity type (n-type) semiconductor layer is not covered with the second electrode layer.

The n-type semiconductor layer is less resistant to alkali than the electrode layer (transparent electrode layer and/or metal electrode layer) and the p-type semiconductor layer. Hence, if an alkaline component enters a module after the module is configured, the second conductivity type (n-type) semiconductor layer is dissolved by the alkaline component in the exposed portion and the residue of the dissolved second conductivity type (n-type) semiconductor layer contains hydrogen and silane. Hydrogen and silane cause erosion and/or reduction in the first conductivity type (p-type) semiconductor layer, the first electrode layer, and the second electrode layer. This degrades the performance of the solar cell. If erosion or reduction occurs in the semiconductor layer, for example, the carrier lifetime is shortened and there is a reduction in photoelectric conversion efficiency. If erosion or reduction occurs in the electrode layer (particularly, the transparent electrode layer), optical characteristics (i.e. reflection characteristics, absorption characteristics) are degraded and/or conductivity is reduced (resistance value is increased) to reduce photoelectric conversion efficiency.

The present disclosure is intended to provide a solar cell suppressing performance degradation due to alkaline components, a method of manufacturing the solar cell, and a solar cell module.

The solar cell according to the present disclosure is a back electrode type solar cell including a semiconductor substrate, a p-type semiconductor layer and a first electrode layer corresponding to the p-type semiconductor layer sequentially laminated on a part of a back surface of the semiconductor substrate, and an n-type semiconductor layer and a second electrode layer corresponding to the n-type semiconductor layer sequentially laminated on a different part of the back surface of the semiconductor substrate. A part of the n-type semiconductor layer lies directly or indirectly atop a part of the adjacent p-type semiconductor layer. The first electrode layer is separated from the n-type semiconductor layer and covers the p-type semiconductor layer. The second electrode layer covers the n-type semiconductor layer entirely in an overlapping portion lying over the p-type semiconductor layer.

The solar cell manufacturing method according to the present disclosure is a method of manufacturing a back electrode type solar cell including a semiconductor substrate, a p-type semiconductor layer and a first electrode layer corresponding to the p-type semiconductor layer sequentially laminated on a part of a back surface of the semiconductor substrate, and an n-type semiconductor layer and a second electrode layer corresponding to the n-type semiconductor layer sequentially laminated on a different part of the back surface of the semiconductor substrate. The method includes a first semiconductor layer-forming step involving forming the p-type semiconductor layer on the part of the back surface of the semiconductor substrate; and a second semiconductor layer-forming step involving forming a precursor to the n-type semiconductor layer on a different part of the back surface of the semiconductor substrate, another second semiconductor layer-forming step involving forming the precursor to the n-type semiconductor layer in such a manner that a part of the precursor to the n-type semiconductor layer lies directly or indirectly atop a part of the adjacent p-type semiconductor layer. The method further includes an electrode layer-forming step involving forming the first electrode layer on the p-type semiconductor layer and the second electrode layer on the precursor to the n-type semiconductor layer, another electrode layer-forming step involving forming the first electrode layer in such a manner that the first electrode layer is separated from the precursor to the n-type semiconductor layer and covers the p-type semiconductor layer, and forming the second electrode layer in such a manner that the second electrode layer covers the precursor to the n-type semiconductor layer in a part of the overlapping portion lying over the p-type semiconductor layer; and a removal step involving removing the precursor to the n-type semiconductor layer not covered with the second electrode layer in a different part of the overlapping portion to form the n-type semiconductor layer in such a manner that the second electrode layer covers the n-type semiconductor layer entirely in the overlapping portion.

The solar cell module according to the present disclosure includes the solar cell described above.

According to the present disclosure, a solar cell suppressing performance degradation due to alkaline components, a method of manufacturing the solar cell, and a solar cell module can be provided.

DETAILED DESCRIPTION

Examples of the embodiment according to the present disclosure will be described below with reference to the accompanying drawings. It is noted that, in the drawings, identical or corresponding parts are denoted by the same reference numerals. For the sake of convenience, hatching, member reference numerals, etc. may be omitted. However, in such cases, other drawings shall be referred to.

(Solar Cell Module)

Figure 1:
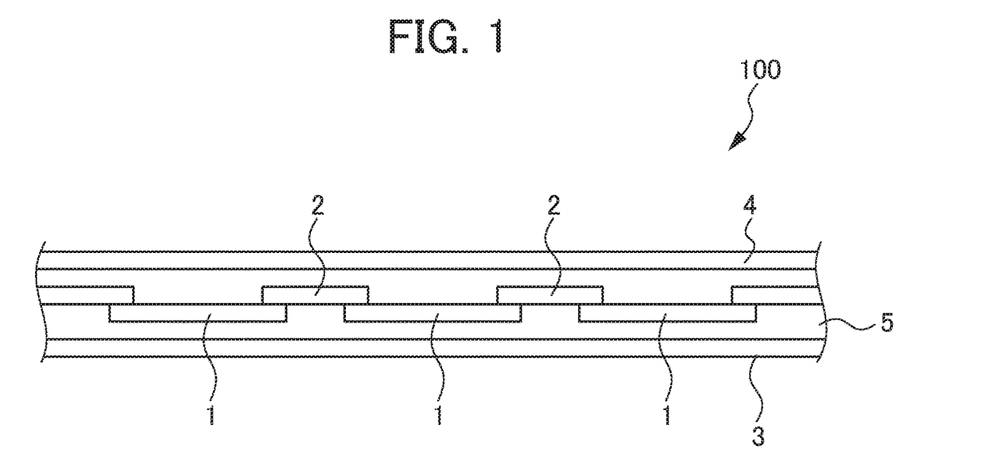
FIG. 1 is a side view illustrating one example of a solar cell module according to the present embodiment.

FIG. 1 is a side view illustrating one example of the solar cell module according to the present embodiment. As shown in FIG. 1, the solar cell module 100 includes a plurality of solar cells 1 arranged in a two-dimensional form.

The solar cells 1 are connected serially and/or in parallel by wiring members 2. Specifically, each of the wiring members 2 is connected to a bus bar part (to be described below) in an electrode layer of each of the solar cells 1. The wiring member 2 is a publicly-known interconnector, for example, a tab.

The solar cells 1 and the wiring members 2 are sandwiched by a light-receptive surface-protective member 3 and a back surface-protective member 4. The space between the light-receptive surface-protective member 3 and the back surface-protective member 4 is filled with a liquid or solid sealing material 5, whereby the solar cells 1 and the wiring members 2 are sealed. The light-receptive surface-protective member 3 is, for example, a glass substrate, and the back surface-protective member 4 is a glass substrate or a metal plate. The sealing material 5 is made of, for example, transparent resin. The solar cell (hereinafter, referred to as a solar cell) 1 will be described below in detail.

(Solar Cell)

Figure 2:
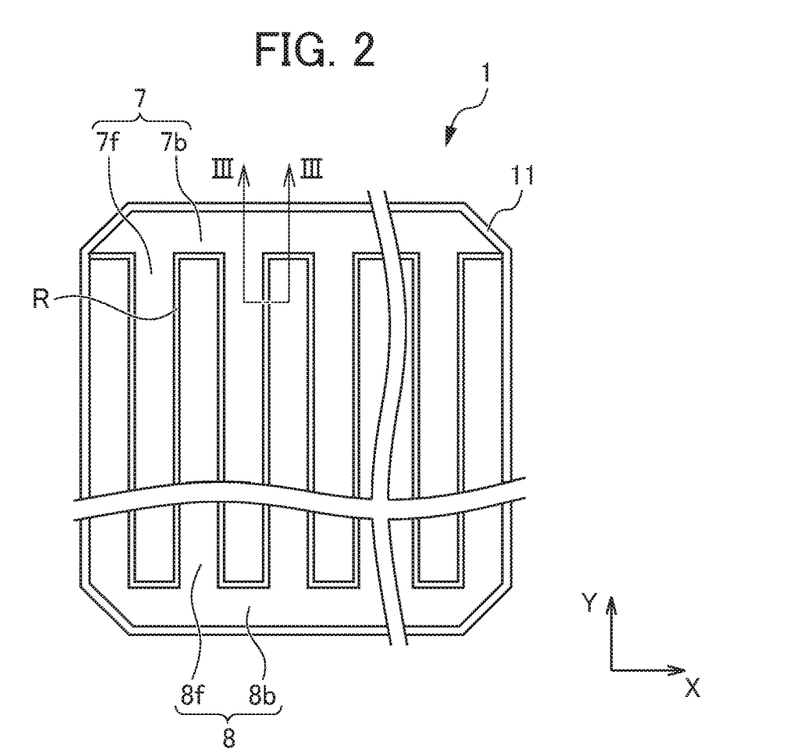
FIG. 2 shows a solar cell according to the present embodiment as viewed from a back surface side.

FIG. 2 shows the solar cell according to the present embodiment as viewed from a back surface side. The solar cell 1 shown in FIG. 2 is a back electrode type solar cell. The solar cell 1 includes an n-type second (second conductivity type) semiconductor substrate 11 with two major surfaces and includes a p-type (first conductivity type) region 7 and an n-type (second conductivity type) region 8 on the major surfaces.

The p-type region 7 is formed into a so-called 'comb shape' with a plurality of finger parts 7f corresponding to comb teeth and a bus bar part 7b corresponding to a supporting part of the comb teeth. The bus bar part 7b extends in a first direction (Direction X) along one peripheral portion of the semiconductor substrate 11. The finger parts 7f extend from the bus bar part 7b in a second direction (Direction Y) intersecting the first direction (Direction X). Similarly, the n-type region 8 is formed into a so-called 'comb shape' with a plurality of finger parts 8f corresponding to comb teeth and a bus bar part 8b corresponding to a supporting part of the comb teeth. The bus bar part 8b extends in the first direction (Direction X) along the other peripheral portion facing a peripheral portion of the semiconductor substrate 11. The finger parts 8f extend from the bus bar part 8b in the second direction (Direction Y). The finger parts 7f and the finger parts 8f are arranged alternately in the first direction (Direction X). The p-type region 7 and the n-type region 8 may be formed into stripe shapes.

The p-type region 7 and the n-type region 8 are separated across a boundary region R. The boundary region R includes an overlapping region R1 where a p-type semiconductor layer and an n-type semiconductor layer described later lie over each other, and a separation region R2 between a first electrode layer 27 and a second electrode layer 37.

Figure 3:
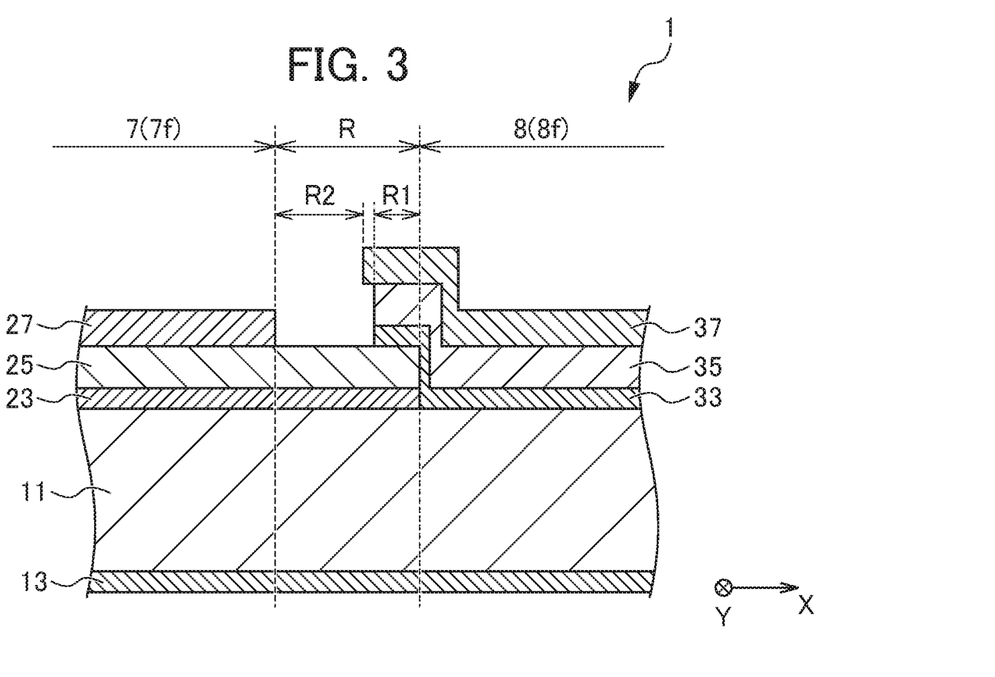
FIG. 3 is a cross-sectional view taken along line in the solar cell shown in FIG. 2.

FIG. 3 is a cross-sectional view taken along lineในthe solar cell shown in FIG. 2. As shown in FIG. 3, the solar cell 1 includes a passivation layer 13 laminated on one major surface on a light-receptive side of the major surfaces of the semiconductor substrate 11. Furthermore, the solar cell 1 includes a passivation layer 23, a p-type (first conductivity type) semiconductor layer 25, and the first electrode layer 27 sequentially laminated on a part of the back surface (mainly, in the p-type region 7) corresponding to the other major surfaces of the semiconductor substrate 11 on the opposite side of the light-receptive surface. The solar cell 1 further includes a passivation layer 33, an n-type (second conductivity type) semiconductor layer 35, and the second electrode layer 37 sequentially laminated on a different part of the back surface (mainly, in the n-type region 8) of the semiconductor substrate 11.

The semiconductor substrate 11 is made of a crystal silicon material such as single crystal silicon or polycrystalline silicon, for example. As an example, the semiconductor substrate 11 is an n-type semiconductor substrate formed by doping an n-type dopant into the crystal silicon material. Phosphorus (P) is used as the n-type dopant, for example. The semiconductor substrate 11 functions as a photoelectric converting substrate for absorbing incident light from the light-receptive surface and generating light carriers (electrons and electron holes). Even if a dark current is relatively low and the intensity of incident light is low, using crystal silicon as a material of the semiconductor substrate 11 achieves a relatively high output (stable output independent of illuminance).

The passivation layer 13 is formed on the light-receptive surface of the semiconductor substrate 11. The passivation layer 23 is formed in the p-type region 7 and the boundary region R on the back surface side of the semiconductor substrate 11. The passivation layer 33 is formed in the n-type region 8 and a part of the boundary region R on the back surface side of the semiconductor substrate 11. The passivation layers 13, 23, and 33 are made of an intrinsic (i-type) amorphous silicon material, for example. The passivation layers 13, 23, and 33 function to suppress recombination of the carriers generated at the semiconductor substrate 11 to increase efficiency of carrier collection.

An anti-reflection layer made of a material such as SiO, SiN, or SiON, for example, may be formed on the passivation layer 13 on the light-receptive surface of the semiconductor substrate 11.

The p-type semiconductor layer 25 is formed on the passivation layer 23, that is, in the p-type region 7 and the boundary region R on the back surface side of the semiconductor substrate 11. The p-type semiconductor layer 25 is made of an amorphous silicon material, for example. As an example, the p-type semiconductor layer 25 is a p-type semiconductor layer formed by doping a p-type dopant into the amorphous silicon material. Boron (B) is used as the p-type dopant, for example.

The n-type semiconductor layer 35 is formed on the passivation layer 33, namely, in the n-type region 8 and a part of the boundary region R on the back surface side of the semiconductor substrate 11. The n-type semiconductor layer 35 is made of an amorphous silicon material, for example. As an example, the n-type semiconductor layer 35 is an n-type semiconductor layer formed by doping an n-type dopant (for example, phosphorus (P, described later) into the amorphous silicon material.

In this way, a part of the n-type semiconductor layer 35 and a part of the passivation layer 33 lie directly atop a part of the adjacent p-type semiconductor layer 25 and a part of the adjacent passivation layer 23 in the overlapping region R1 of the boundary region R.

The first electrode layer 27 is formed on the p-type semiconductor layer 25, more specifically, in the p-type region 7 on the back surface side of the semiconductor substrate 11. The second electrode layer 37 is formed on the n-type semiconductor layer 35, more specifically, in the n-type region 8 and a part of the boundary region R on the back surface side of the semiconductor substrate 11. The first electrode layer 27 and the second electrode layer 37 may be composed of a transparent electrode layer and a metal electrode layer, or they may be composed only of a metal electrode layer. The transparent electrode layer is made of a transparent conductive material. For example, indium tin oxide (ITO: complex oxide of indium oxide and tin oxide) is used as the transparent conductive material. The metal electrode layer is made of a conductive paste material containing a metal powder such as silver.

As described above, the first electrode layer 27 is separated from the n-type semiconductor layer 35 and the passivation layer 33 and covers the p-type semiconductor layer 25. The second electrode layer 37 covers the p-type semiconductor layer 25. More specifically, the second electrode layer 37 covers the n-type semiconductor layer 35 entirely in an overlapping portion R1 lying over the p-type semiconductor layer 25. In the present embodiment, the second electrode layer 37 extends beyond a side edge of the n-type semiconductor layer 35 in the overlapping portion R1 toward the first electrode layer 27. In other words, the separation region R2 between the first electrode layer 27 and the second electrode layer 37 does not overlap the overlapping region R1 between the p-type semiconductor layer 25 and the n-type semiconductor layer 35.

The method of manufacturing the solar cell 1, particularly, the method of forming each layer on the back surface side according to the present embodiment will be described next by referring to FIGS. 4A to 4D. FIGS. 4A to 4D show a first semiconductor layer-forming step, a second semiconductor layer-forming step, an electrode layer-forming step, and a removal step respectively in the solar cell manufacturing method according to the present embodiment.

Figure 4A:
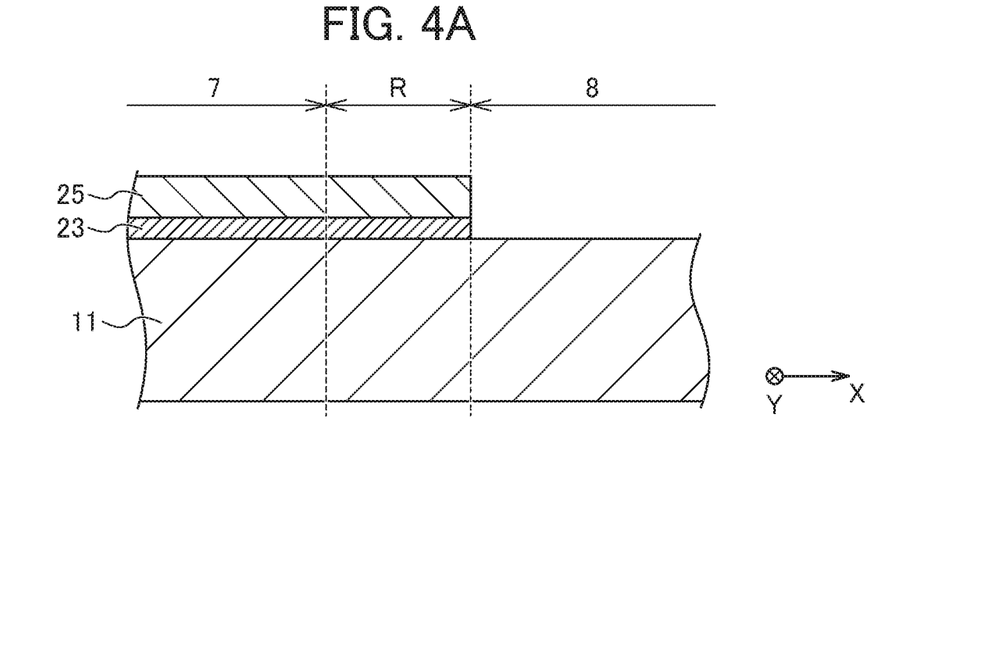
FIG. 4A shows the first semiconductor layer-forming step in the solar cell manufacturing method according to the present embodiment.

First, as shown in FIG. 4A, the passivation layer 23 and the p-type semiconductor layer 25 are formed on a part of the back surface of the semiconductor substrate 11, specifically, in the p-type region 7 and the boundary region R (first semiconductor layer-forming step). As an example, a precursor to a passivation layer and a precursor to a p-type semiconductor layer may be laminated on the entire back surface of the semiconductor substrate 11 using the CVD method. Then, the passivation layer 23 and the p-type semiconductor layer 25 may be formed by using an etching method. For example, a solution of acid such as hydrofluoric acid is used as a solution for the etching of the precursor to the p-type semiconductor layer. Alternatively, during lamination of the passivation layer and the p-type semiconductor layer on the back surface of the semiconductor substrate 11 using the CVD method, the passivation layer 23 and the p-type semiconductor layer 25 may be formed using a mask.

Figure 4B:
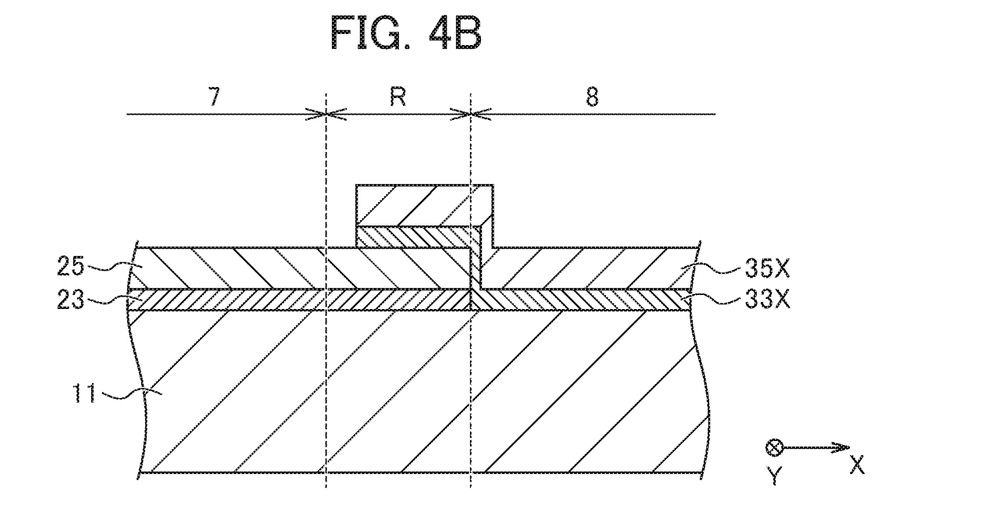
FIG. 4B shows the second semiconductor layer-forming step in the solar cell manufacturing method according to the present embodiment.

Next, as shown in FIG. 4B, a precursor 33X to a passivation layer and a precursor 35X to an n-type semiconductor layer are formed on a different part of the back surface of the semiconductor substrate 11, more specifically, in the n-type region 8 and a part of the boundary region R (second semiconductor layer-forming step). At this time, the precursor 33X to the passivation layer and the precursor 35X to the n-type semiconductor layer are formed in such a manner that a part of the precursor 33X to the passivation layer and a part of the precursor 35X to the n-type semiconductor layer lie directly atop a part of the adjacent passivation layer 23 and a part of the adjacent p-type semiconductor layer 25. As an example, a precursor to a passivation layer and a precursor to an n-type semiconductor layer may be laminated on the entire back surface of the semiconductor substrate 11 using the CVD method. Then, the precursor 33X to the passivation layer and the precursor 35X to the n-type semiconductor layer may be formed using an etching method (first etching process). For example, a solution of alkali such as potassium hydroxide is used as a solution for the etching of the precursor to the n-type semiconductor layer. Alternatively, during lamination of the passivation layer and the n-type semiconductor layer on the back surface of the semiconductor substrate 11 using the CVD method, the precursor 33X to the passivation layer and the precursor 35X to the p-type semiconductor layer may be formed using a mask.

Figure 4C:
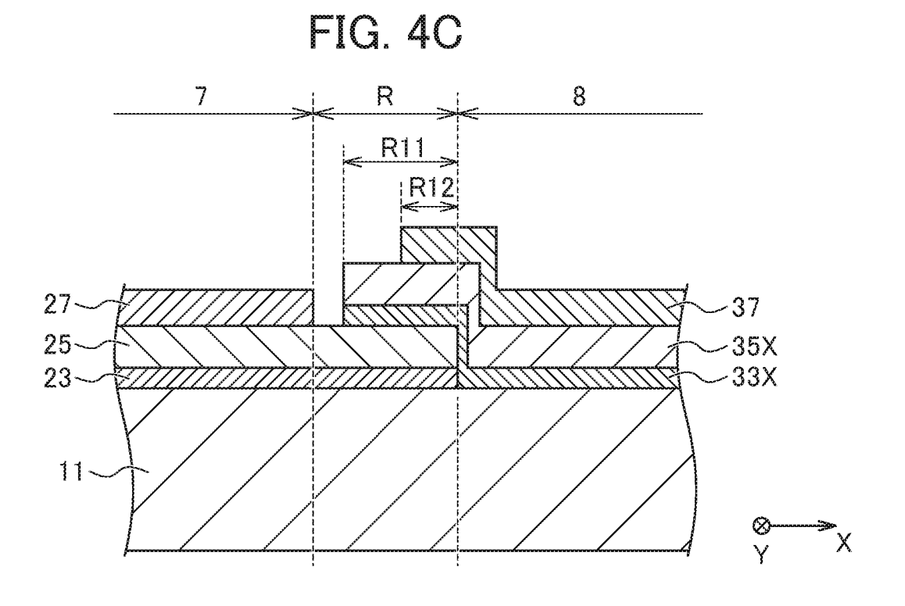
FIG. 4C shows the electrode layer-forming step in the solar cell manufacturing method according to the present embodiment.

Next, as shown in FIG. 4C, the first electrode layer 27 is formed on the p-type semiconductor layer 25 and the second electrode layer 37 is formed on the precursor 35X to the n-type semiconductor layer (electrode layer forming step). At this time, the first electrode layer 27 is formed in such a manner that the first electrode layer 27 is separated from the precursor 33X to the passivation layer and the precursor 35X to the n-type semiconductor layer and covers the p-type semiconductor layer 25. Further, the second electrode layer 37 is formed in such a manner that the second electrode layer 37 covers the precursor 35X to the n-type semiconductor layer in a part R12 of the overlapping portion R11 lying over the p-type semiconductor layer 25. For example, an electrode layer may be laminated on the entire back surface of the semiconductor substrate 11, and then the first electrode layer 27 and the second electrode layer 37 may be formed using an etching method. Alternatively, during lamination of the electrode layer on the back surface of the semiconductor substrate 11, the first electrode layer 27 and the second electrode layer 37 may be formed using a mask. The transparent electrode layer in the first electrode layer 27 and the second electrode layer 37 may be laminated using the sputtering method. Furthermore, the metal electrode layer in the first electrode layer 27 and the second electrode layer 37 may be laminated using a printing method or a deposition method.

Figure 4D:
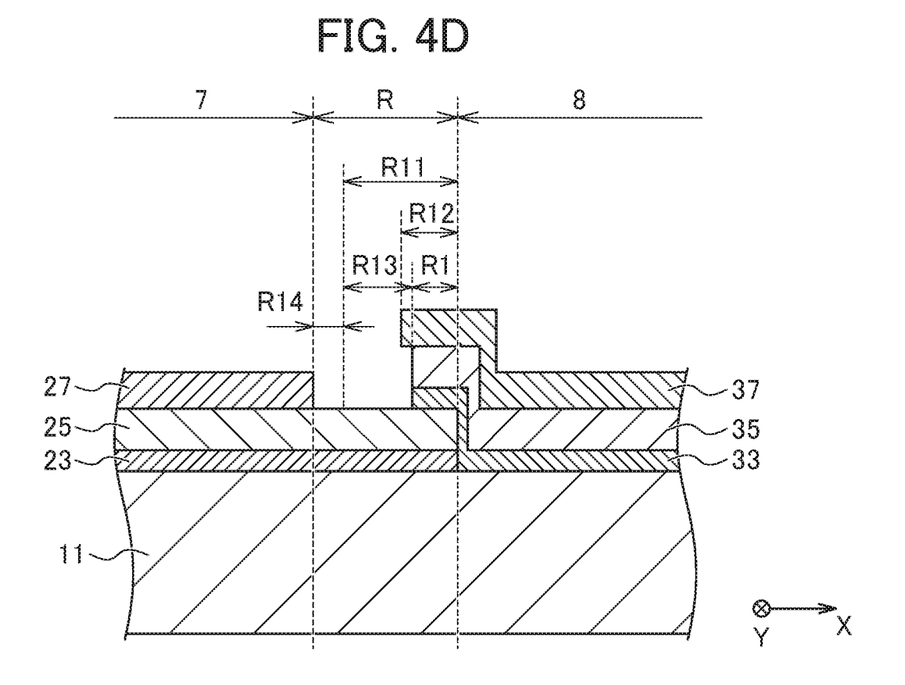
FIG. 4D shows the removal step in the solar cell manufacturing method according to the present embodiment.

Next, as shown in FIG. 4D, in the overlapping portion R11, the precursor 33X to the passivation layer and the precursor 35X to the n-type semiconductor layer not covered with the second electrode layer 37 are removed in the different part R13 to form the passivation layer 33 and the n-type semiconductor layer 35 (removal step). As a result, the second electrode layer 37 covers the passivation layer 33 and the n-type semiconductor layer 35 entirely in the overlapping portion R1. As an example, the precursor 33X to the passivation layer and the precursor 35X to the n-type semiconductor layer in the different part R13 of the overlapping portion R11 may be removed by an etching method (second etching process) using the second electrode layer 37 as a mask. The etching shown in FIG. 4D has been described as so-called 'under-etching', by which dissolving proceeds not only in the perpendicular direction of the different part R13 but also in a direction intersecting the perpendicular direction (namely, in the width direction). However, the present disclosure is not limited thereto. Alternatively, a laser method may be used for removing the precursor 33X to the passivation layer and the precursor 35X to the n-type semiconductor layer in the different part R13 of the overlapping portion R11.

Figure 5A:
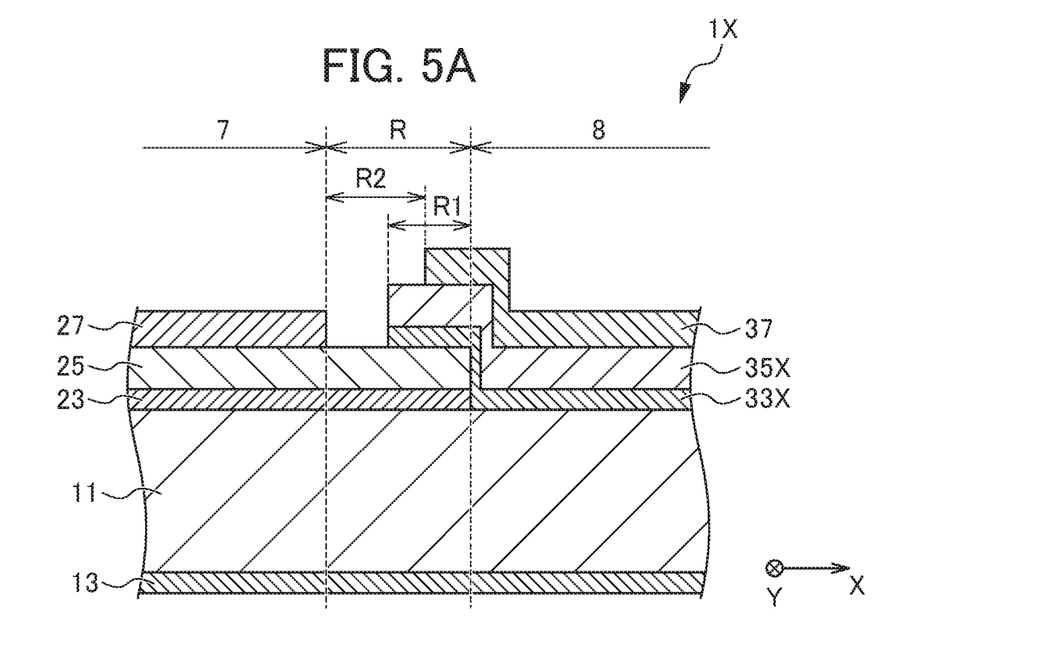
FIG. 5A is a partial cross-sectional view of the solar cell according to a conventional example (corresponding to a cross-sectional view taken along line in FIG. 2)

A solar cell according to a conventional example (corresponding to the solar cell described above disclosed in Japanese Unexamined Patent Application, Publication No. 2013-131586) will be described next by referring to FIG. 5A. FIG. 5A is a partial cross-sectional view of a solar cell according to the conventional example (corresponding to a cross-sectional view taken along line in FIG. 2). The solar cell 1X according to the conventional example shown in FIG. 5A is a solar cell manufactured by omitting the removal step in the aforementioned method of manufacturing the solar cell 1 according to the present embodiment. Thus, in the solar cell 1X, the second electrode layer 37 formed on the n-type semiconductor layer 35X is shorter than the n-type semiconductor layer 35X and the passivation layer 33X in the overlapping region R1 between the p-type semiconductor layer 25 and the passivation layer 23, and the n-type semiconductor layer 35X and the passivation layer 33X, as described above. That is, in the overlapping region R1, an exposed portion is formed where the n-type semiconductor layer 35X and the passivation layer 33X are not covered with the second electrode layer 37. In other words, the separation region R2 between the first electrode layer 27 and the second electrode layer 37 overlaps the overlapping region R1 between the p-type semiconductor layer 25 and the passivation layer 23, and the n-type semiconductor layer 35X and the passivation layer 33X.

As described above, if there is a region in the absence of a semiconductor layer on the back surface side of the semiconductor substrate 11, the carriers (electrons and electron holes) recombine in this region to cause a reduction in photoelectric conversion efficiency. In regards to this point, like in the solar cell 1 according to the present embodiment, a part of the n-type semiconductor layer 35X and a part of the passivation layer 33X lie atop a part of the adjacent p-type semiconductor layer 25 and a part of the adjacent passivation layer 23 in the solar cell 1X according to the conventional example. This means that even allowing for manufacturing error, there will be no region in which there is no semiconductor layer, thus suppressing the reduction in photoelectric conversion efficiency.

Furthermore in some cases, photoelectric conversion efficiency is reduced by a leakage current flowing from the n-type semiconductor layer 35X lying atop a part of the p-type semiconductor layer 25 through the p-type semiconductor layer 25 into the first electrode layer 27 formed on the p-type semiconductor layer 25. In regards to this point, in the solar cell 1X according to the conventional example, the first electrode layer 27 is separated from the n-type semiconductor layer 35X and the passivation layer 33X, like in the solar cell 1 according to the present embodiment. This reduces the leakage current from the n-type semiconductor layer 35X through the p-type semiconductor layer 25 into the first electrode layer 27 and suppresses the reduction in photoelectric conversion efficiency.

If the second electrode layer 37 on the n-type semiconductor layer 35X is also formed in the overlapping region R1 between the p-type semiconductor layer 25 and the passivation layer 23, and the n-type semiconductor layer 35X and the passivation layer 33X, photoelectric conversion efficiency is reduced by a leakage current flowing from the p-type semiconductor layer 25 through the n-type semiconductor layer 35X into the second electrode layer 37. In regards to this point, in the solar cell 1X according to the conventional example, the second electrode layer 37 formed on the n-type semiconductor layer 35X is shorter than the n-type semiconductor layer 35X and the passivation layer 33X. That is, in the overlapping region R1 between the p-type semiconductor layer 25 and the passivation layer 23, and the n-type semiconductor layer 35X and the passivation layer 33X, there is an exposed portion where the n-type semiconductor layer 35X is not covered with the second electrode layer 37. This reduces the leakage current from the p-type semiconductor layer 25 through the n-type semiconductor layer 35X into the second electrode layer 37 and thereby suppresses the reduction in photoelectric conversion efficiency.

Figure 5B:
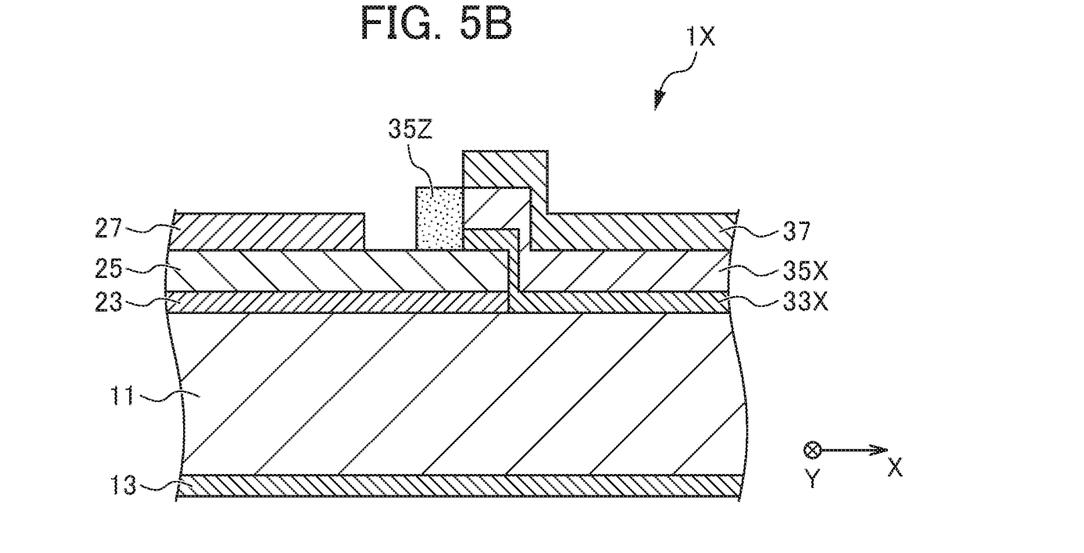
FIG. 5B explains a problem occurring in solar cells according to the conventional example.
Figure 5C:
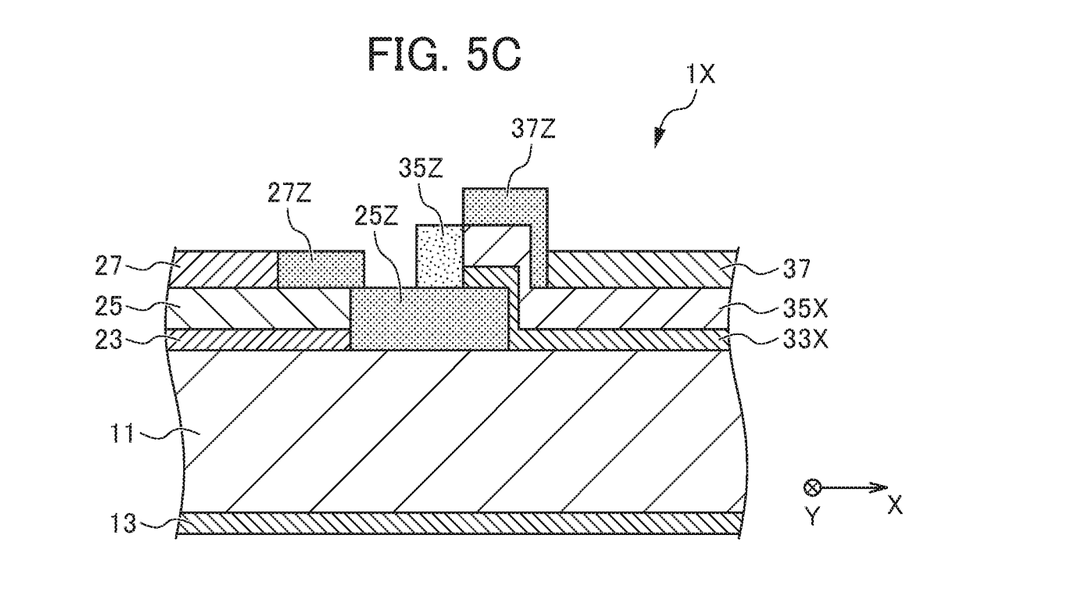
FIG. 5C explains the problem occurring in solar cells according to the conventional example.

The n-type semiconductor layer is less resistant to alkali than the electrode layer and the p-type semiconductor layer. Hence, if an alkaline component enters a module after the module is configured, the n-type semiconductor layer 35X and the passivation layer 33X are dissolved by the alkaline component in the exposed portion and the residue 35Z of the dissolved n-type semiconductor layer 35X and passivation layer 33X contains hydrogen and silane, as shown in FIG. 5B. As shown in FIG. 5C, the hydrogen and silane contained in the residue 35Z of the n-type semiconductor layer 35X and the passivation layer 33X cause erosion and/or reduction in the part 25Z of the p-type semiconductor layer 25 and the passivation layer 23, the part 27Z of the first electrode layer 27, and the part 37Z of the second electrode layer 37. This degrades the performance of the solar cell 1X. If erosion or reduction occurs in the part 25Z of the p-type semiconductor layer 25 and the passivation layer 23, for example, the carrier lifetime is shortened and photoelectric conversion efficiency is reduced. If erosion or reduction occurs in the part 27Z of the first electrode layer 27 and the part 37Z of the second electrode layer 37 (particularly, in the transparent electrode layer), optical characteristics (i.e. reflection characteristics, absorption characteristics) are degraded and/or conductivity is reduced (resistance value is increased) and photoelectric conversion efficiency is reduced. If erosion and/or reduction occurs in the insulating layer (described later), the function preventing leakage currents and the function preventing diffusion of dopant in the doped conductivity type semiconductor layer, etc. decline.

In contrast to this, in the solar cell 1 according to the present embodiment, the second electrode layer 37 covers the n-type semiconductor layer 35 and the passivation layer 33 entirely in the overlapping portion R1 lying over the p-type semiconductor layer 25 and the passivation layer 23. As such, the second electrode layer 37 acts to protect the n-type semiconductor layer 35 and the passivation layer 33 in the overlapping portion R1 from an alkaline component (improvement of chemical-resistance). In this way, even if an alkaline component enters a module after the module is configured, the n-type semiconductor layer 35 and the passivation layer 33 are not dissolved by the alkaline component. This prevents the occurrence of a residue (containing hydrogen and silane) resulting from the dissolving of the alkaline component and prevents the occurrence of erosion or reduction in the p-type semiconductor layer 25, the passivation layer 23, the first electrode layer 27, and the second electrode layer 37. As a result, performance degradation of the solar cell 1 is suppressed to curb reliability reduction of the solar cell 1. The coverage of the second electrode layer 37 in the entire overlapping region R1 is substantially equal to the coverage of the second electrode layer 37 in the p-type region 7 and the n-type region 8. The second electrode layer 37 is not formed in such a manner as to provide an intentional void such as an opening in the entire overlapping region R1.

Furthermore, in the solar cell 1 according to the present embodiment, the second electrode layer 37 extends beyond the side edges of the n-type semiconductor layer 35 and the passivation layer 33 in the overlapping portion R1 towards the first electrode layer 27. As such, the second electrode layer 37 acts to protect the n-type semiconductor layer 35 and the passivation layer 33 in the overlapping portion R1 from an alkaline component (improvement of chemical-resistance).

In the solar cell manufacturing method according to the present embodiment, in the second semiconductor layer-forming step and the electrode layer-forming step, the precursor 35X to the n-type semiconductor layer, the precursor 33X to the passivation layer, and the first electrode layer 27 are formed in such a manner as to separate the first electrode layer 27 from the precursor 35X to the n-type semiconductor layer and the precursor 33X to the passivation layer. Thus, in the neighboring region R14 of the first electrode layer 27 (FIG. 4), the process of removing the n-type semiconductor layer 35 and the passivation layer 33 is performed twice through the second semiconductor layer-forming step, the electrode layer-forming step, and the removal step. Specifically, in the neighboring region R14 of the first electrode layer 27, the process of etching the n-type semiconductor layer 35 and the passivation layer 33 is performed twice (see FIGS. 4B and 4D). As a result, residue (that left undissolved) of the n-type semiconductor layer 35 and the passivation layer 33 is reduced in the neighboring region R14 of the first electrode layer 27. This reduces the leakage current flowing from the n-type semiconductor layer 35 into the first electrode layer 27 and resulting from the undissolved residue of the n-type semiconductor layer 35 and the passivation layer 33 between the n-type semiconductor layer 35 and the passivation layer 33, and the first electrode layer 27. In this way, the reduction in photoelectric conversion efficiency is suppressed to increase an output current.

(Modification of the Solar Cell)

In the solar cell 1 described as an example in the aforementioned embodiment, a part of the passivation layer 33 and a part of the n-type semiconductor layer 35 lie directly atop a part of the adjacent passivation layer 23 and a part of the adjacent p-type semiconductor layer 25. Alternatively, in the solar cell 1, a part of the passivation layer 33 and a part of the n-type semiconductor layer 35 may lie atop a part of the adjacent passivation layer 23 and a part of the adjacent p-type semiconductor layer 25 indirectly, via an insulating layer.

Figure 6A:
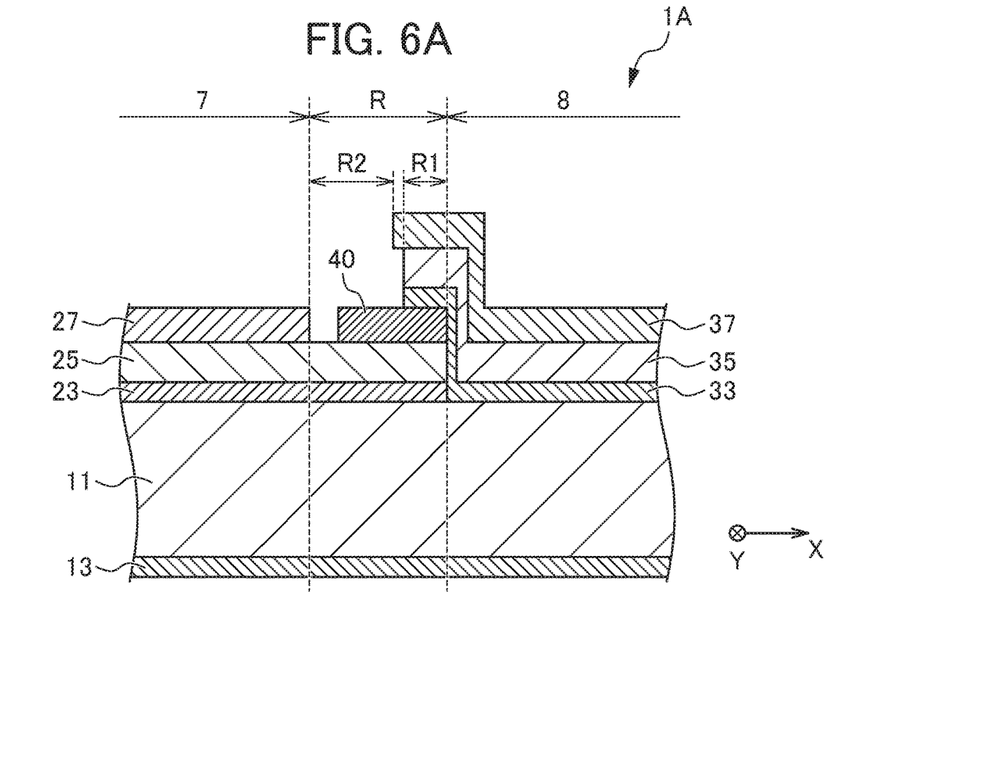
FIG. 6A is a partial cross-sectional view of a solar cell according to the modifications of the present embodiment (corresponding to a cross-sectional view taken along line in FIG. 2)

FIG. 6A is a partial cross-sectional view of the solar cell according to the modifications of the present embodiment (corresponding to a cross-sectional view taken along line in FIG. 2). The solar cell 1A according to the modifications shown in FIG. 6A differs from the solar cell 1 in FIG. 3 in that, in the overlapping portion R1 between the passivation layer 23 and the p-type semiconductor layer 25, and the passivation layer 33 and the n-type semiconductor layer 35, an insulating layer 40 is further provided between the passivation layer 23 and the p-type semiconductor layer 25, and the passivation layer 33 and the n-type semiconductor layer 35. According to the modifications, the insulating layer 40 extends beyond a side edge of the n-type semiconductor layer 35 in the overlapping portion R1 towards the first electrode layer 27.

(Manufacturing Method)

The method of manufacturing the solar cell 1A, particularly, a method of forming each layer on the back surface side according to the modifications will be described next by referring to FIGS. 7A to 7D. FIGS. 7A to 7D show a first semiconductor layer-forming step, a second semiconductor layer-forming step, an electrode layer-forming step, and a removal step respectively in the solar cell manufacturing method according to the modifications.

Figure 7A:
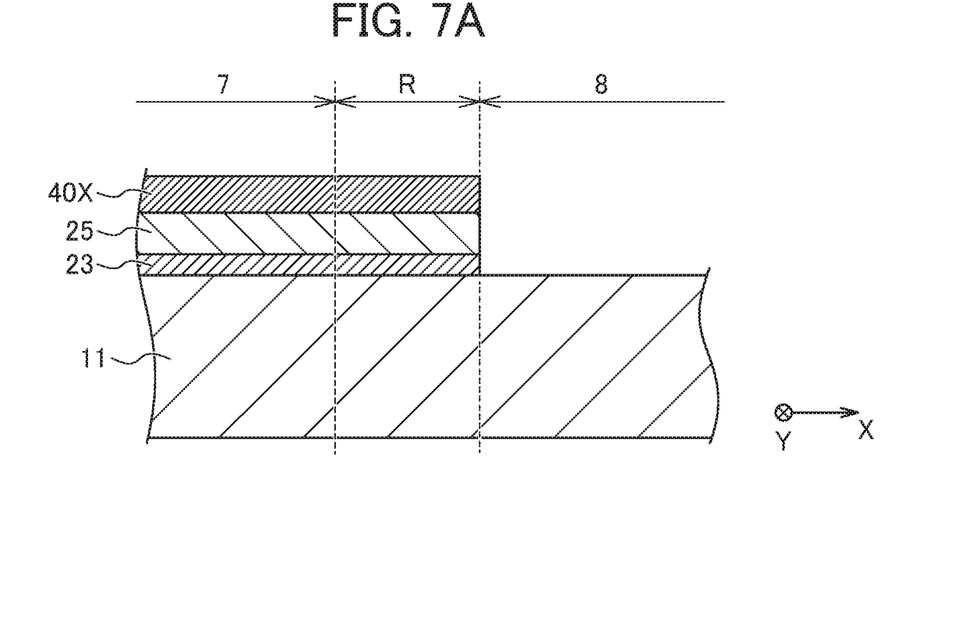
FIG. 7A shows the first semiconductor layer-forming step in the solar cell manufacturing method according to the modifications of the present embodiment.

First, as shown in FIG. 7A, the passivation layer 23, the p-type semiconductor layer 25, and the precursor 40X to the insulating layer 40 are formed on a part of the back surface of the semiconductor substrate 11, more specifically, in the p-type region 7 and the boundary region R (first semiconductor layer forming step).

Figure 7B:
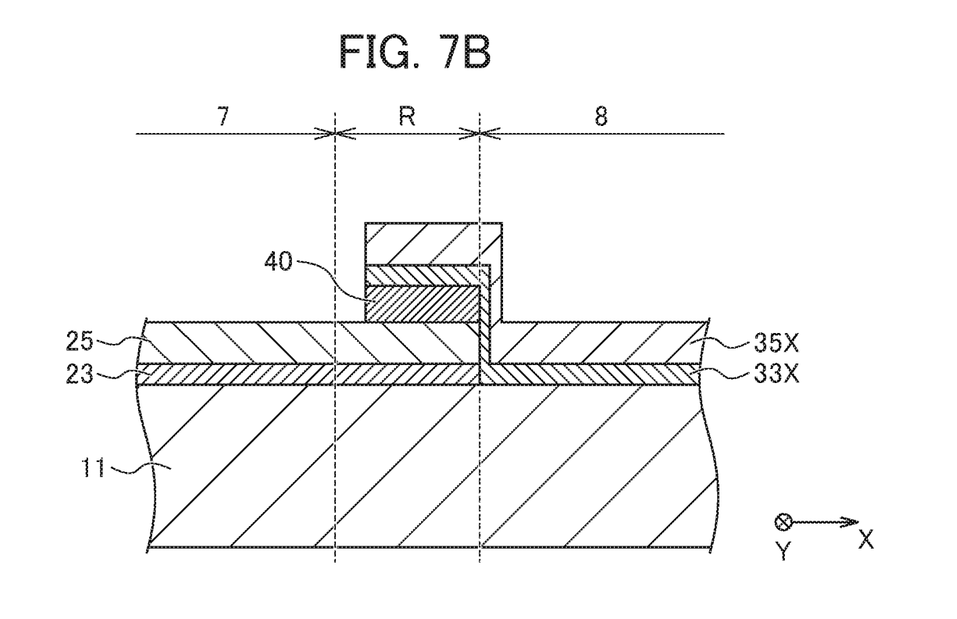
FIG. 7B shows the second semiconductor layer-forming step in the solar cell manufacturing method according to the modifications of the present embodiment.

Next, as shown in FIG. 7B, the precursor 33X to the passivation layer and the precursor 35X to the n-type semiconductor layer are formed on a different part of the back surface of the semiconductor substrate 11, specifically, in the n-type region 8 and a part of the boundary region R. Furthermore, the insulating layer 40 is formed in a part of the boundary region R (second semiconductor layer-forming step). At this time, the precursor 33X to the passivation layer and the precursor 35X to the n-type semiconductor layer are formed in such a manner that a part of the precursor 33X to the passivation layer and a part of the precursor 35X to the n-type semiconductor layer lie atop a part of the adjacent passivation layer 23 and a part of the adjacent p-type semiconductor layer 25 indirectly, via the insulating layer 40.

Figure 7C:
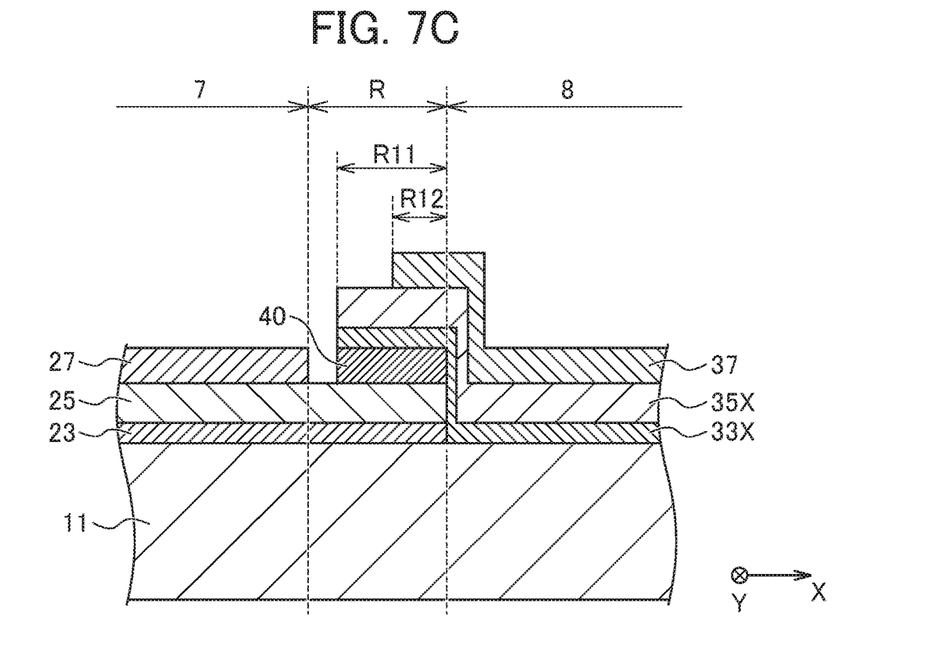
FIG. 7C shows the electrode layer-forming step in the solar cell manufacturing method according to the modifications of the present embodiment.

Next, as shown in FIG. 7C, the first electrode layer 27 is formed on the p-type semiconductor layer 25 and the second electrode layer 37 is formed on the precursor 35X to the n-type semiconductor layer 35 (electrode layer-forming step). At this time, the first electrode layer 27 is formed in such a manner that the first electrode layer 27 is separated from the precursor 33X to the passivation layer and the precursor 35X to the n-type semiconductor layer and covers the p-type semiconductor layer 25. Furthermore, the second electrode layer 37 is formed in such a manner that the second electrode layer 37 covers the precursor 35X to the n-type semiconductor layer in the part R12 of the overlapping portion R11 lying over the p-type semiconductor layer 25.

Figure 7D:
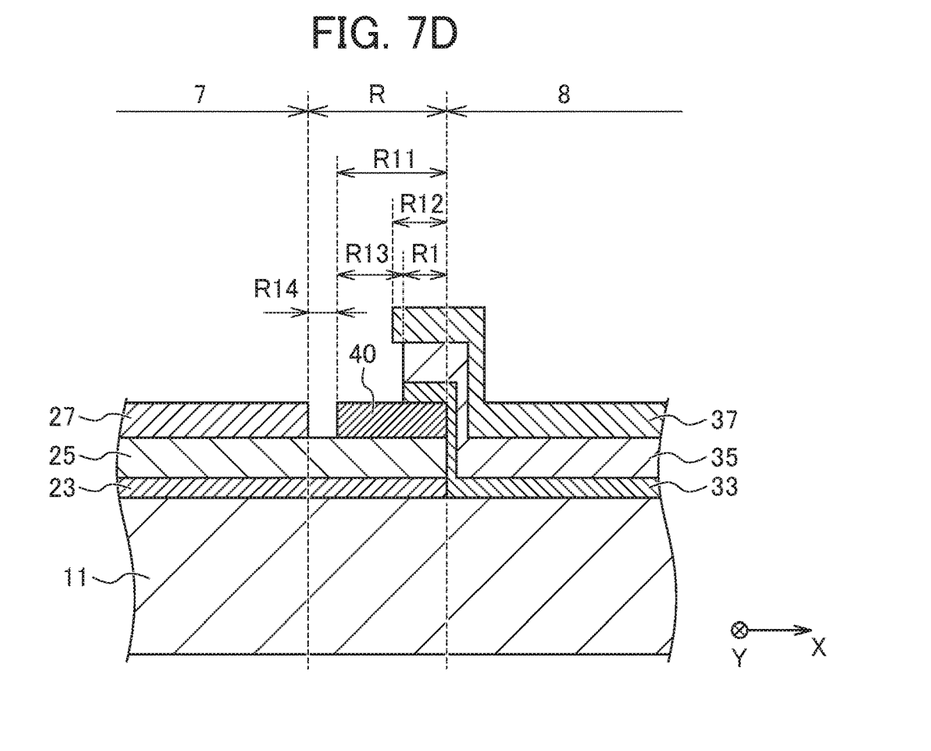
FIG. 7D shows the removal step in the solar cell manufacturing method according to the modifications of the present embodiment.

Next, as shown in FIG. 7D, in the overlapping portion R11, the precursor 33X to the passivation layer and the precursor 35X to the n-type semiconductor layer not covered with the second electrode layer 37 are removed in the different part R13 to form the passivation layer 33 and the n-type semiconductor layer 35 (removal step). As a result, the second electrode layer 37 covers the passivation layer 33 and the n-type semiconductor layer 35 entirely in the overlapping portion R1.

The solar cell 1A and the method of manufacturing the solar cell 1A according to the modifications can also achieve advantages comparable to those achieved by the solar cell 1 and the method of manufacturing the solar cell 1 described above according to the present embodiment.

Furthermore, in the solar cell 1A according to the modifications, in the overlapping portion R1 between the p-type semiconductor layer 25 and the passivation layer 23, and the n-type semiconductor layer 35 and the passivation layer 33, the presence of the insulating layer 40 provided between the p-type semiconductor layer 25 and the passivation layer 23, and the n-type semiconductor layer 35 and the passivation layer 33, reduces the leakage current flowing from the p-type semiconductor layer 25 through the n-type semiconductor layer 35 into the second electrode layer 37. This suppresses the reduction in photoelectric conversion efficiency and curbs the reduction in output current.

Further, in the solar cell 1A according to the modifications, the insulating layer 40 extends beyond the side edges of the n-type semiconductor layer 35 and the passivation layer 33 in the overlapping portion R1 toward the first electrode layer 27. By doing so, the insulating layer 40 acts to protect the p-type semiconductor layer 25 and the passivation layer 23 in the vicinity of the n-type semiconductor layer 35 and the passivation layer 33 in the overlapping portion R1. As such, even if for example the side edges of the n-type semiconductor layer 35 and the passivation layer 33 in the overlapping portion R1 are dissolved by an alkaline component and a residue of the n-type semiconductor layer 35 and the passivation layer 33 containing hydrogen and silane is produced, the insulating layer 40 still acts to protect the p-type semiconductor layer 25 and the passivation layer 23 from erosion and/or reduction. In this way, the shortening of carrier lifetime due to the alkaline component is suppressed.

Figure 6B:
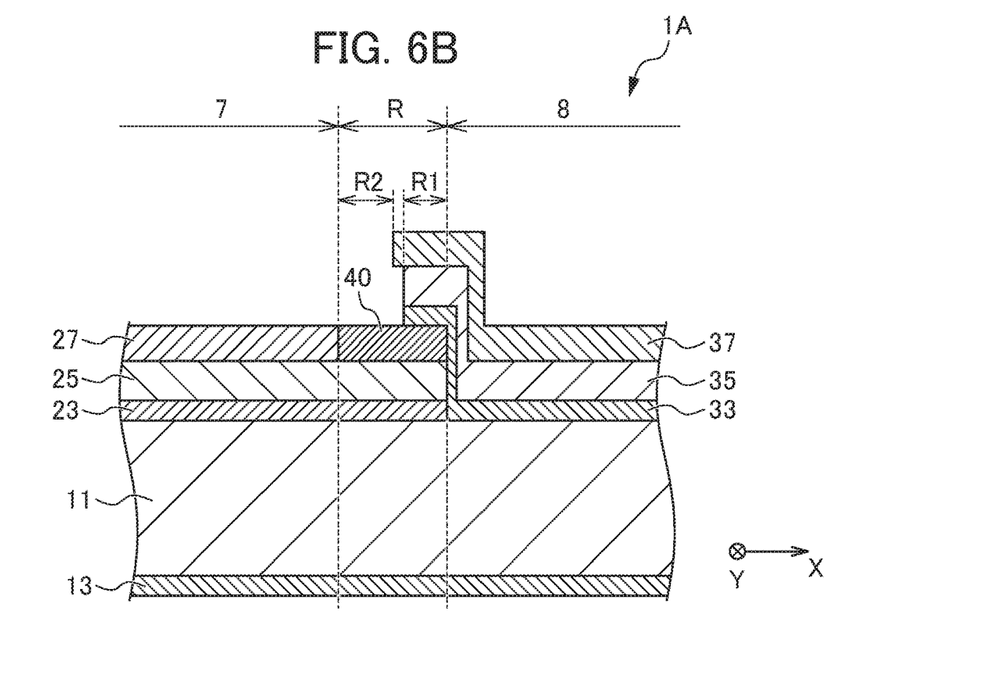
FIG. 6B is a partial cross-sectional view of the solar cell according to the modifications of the present embodiment (corresponding to a cross-sectional view taken along line in FIG. 2)

As shown in FIG. 6B, the first electrode layer 27 may be adjacent to the insulating layer 40. Extending the first electrode layer 27 further in this way reduces the recombination of the carriers (electrons and electron holes) to a greater extent and thereby suppresses the reduction in photoelectric conversion efficiency.

While the embodiments according to the present disclosure have been described so far, the present disclosure is not limited to the above-described embodiments, and various modifications are available. In the present embodiment, the heterojunction type solar cell 1 as shown in FIG. 3 has been described. In an example, the characteristics according to the present disclosure may be applied to various types of solar cells, such as a homojunction type solar cell, and are not limited to such a heterojunction type solar cell.

While the n-type semiconductor substrate has been described as an example of the semiconductor substrate 11 according to the present embodiment, the semiconductor substrate 11 may alternatively be a p-type semiconductor substrate formed by doping a p-type dopant (for example, boron (B), described above) into a crystal silicon material.

While the solar cell described in the present embodiment includes the crystal silicon substrate, the present disclosure is not limited thereto. For example, the solar cell may include a gallium arsenide (GaAs) substrate.

What is claimed is:

1. A back electrode type solar cell comprising:
   a semiconductor substrate having a back surface;
   a p-type semiconductor layer and a first electrode layer sequentially laminated on an area of the back surface of the semiconductor substrate; and
   an n-type semiconductor layer and a second electrode layer sequentially laminated on a different area of the back surface of the semiconductor substrate, wherein
   a portion of the n-type semiconductor layer directly or via a passivation layer only overlaps a portion of the p-type semiconductor layer, and the n-type semiconductor layer extends along a side wall of the p-type semiconductor layer directly or via only a passivation layer,
   the first electrode layer is laterally separated from the n-type semiconductor layer and overlaps a different portion of the p-type semiconductor layer,
   the second electrode layer entirely and directly covers the portion of the n-type semiconductor layer that overlaps the portion of the p-type semiconductor layer,
   the n-type semiconductor layer has an uncovered side edge facing in a direction toward the first electrode layer, and
   the second electrode layer extends beyond the uncovered side edge of the n-type semiconductor layer in the direction toward the first electrode layer.

2. The solar cell according to claim 1, further comprising an insulating layer extending between the portion of the p-type semiconductor layer and the portion of the n-type semiconductor layer.

3. The solar cell according to claim 2, wherein the insulating layer extends beyond the uncovered side edge of the n-type semiconductor layer in the direction toward the first electrode layer.

4. The solar cell according to claim 3, wherein the first electrode layer is adjacent to the insulating layer.

5. A solar cell module comprising the solar cell according to claim 1.

6. A solar cell module comprising the solar cell according to claim 2.

7. A solar cell module comprising the solar cell according to claim 3.

8. A solar cell module comprising the solar cell according to claim 4.

* * * * *